United States Patent [19]
Nakashiba et al.

[11] Patent Number: 6,081,018
[45] Date of Patent: Jun. 27, 2000

[54] SOLID STATE IMAGE SENSOR

[75] Inventors: Yasutaka Nakashiba; Keisuke Hatano, both of Tokyo, Japan

[73] Assignee: NEC Corporation, Tokyo, Japan

[21] Appl. No.: 09/327,227

[22] Filed: Jun. 7, 1999

[30] Foreign Application Priority Data

Jun. 5, 1998 [JP] Japan .................................. 10-157376

[51] Int. Cl.[7] ..................... H01L 31/0232; H01L 29/768; H01L 29/788; H01L 31/00
[52] U.S. Cl. ......................... 257/435; 257/232; 257/233; 257/316; 257/324; 257/432; 257/440
[58] Field of Search .................................. 257/315, 316, 257/324, 232, 233, 239, 432, 435, 440

[56] References Cited

U.S. PATENT DOCUMENTS

| | | | |
|---|---|---|---|
| 5,357,128 | 10/1994 | Shinji ....................... | 257/239 |
| 5,479,049 | 12/1995 | Aoki et al. ................ | 257/642 |
| 5,493,143 | 2/1996 | Hokari ..................... | 257/432 |
| 5,514,888 | 5/1996 | Sano et al. ............... | 257/232 |

FOREIGN PATENT DOCUMENTS 9-93496  4/1997  Japan .
2722972  11/1997  Japan .

*Primary Examiner*—Ngân V. Ngô
*Attorney, Agent, or Firm*—Hutchins, Wheeler & Dittmar

[57] ABSTRACT

In a solid state image sensor comprising a pixel array section formed at a semiconductor substrate, and a substrate voltage setting circuit provided at the semiconductor substrate as a peripheral circuit of the pixel array section and including a non-volatile memory transistor, a light block film is formed to cover a gate electrode of the non-volatile memory transistor. This light block film is constituted of the same primary color filters as the primary color filters provided in the pixel array section. Thus, since the injecting of the light to a gate insulating film of the non-volatile memory transistor is prevented, after the electric charges are trapped in the gate insulating film of the non-volatile memory transistor such as the MNOS type, the MONOS type and the floating gate for giving a desired substrate voltage, the variation of the threshold voltage of the non-volatile memory transistor is prevented, with the result that substrate voltage generating circuit of the peripheral circuit can supply the stabilized substrate voltage having less variation, and therefore, the solid state image sensor operates with a high reliability.

9 Claims, 5 Drawing Sheets

SOLID STATE IMAGE SENSOR

BACKGROUND OF THE INVENTION

1. Field of the Invention

The present invention relates to a solid state image sensor, and more specifically to a solid state image sensor having a peripheral circuit including a non-volatile memory transistor of the structure for trapping electric charges in an insulating means under a gate electrode to change a threshold voltage.

2. Description of Related Art

Ordinarily, a substrate voltage of a solid state image sensor is set to a voltage to minimize a blooming of a signal charge in a photoelectric conversion section. This voltage is different from one device from another, and therefore, it was required to be set in each device after it is assembled in a camera. In order to set this voltage, various circuits have been proposed. For example, when a substrate voltage generating circuit is internally provided in the device as a peripheral circuit, the substrate voltage generating circuit generates an optimum value from an externally supplied voltage. This optimum value is obtained by storing electric charges in a non-volatile memory transistor located in a resistor dividing circuit to change a threshold voltage of the non-volatile memory transistor thereby to obtain a desired voltage.

The non-volatile memory transistor included in the substrate voltage generating circuit includes an MNOS (metal-$Si_3N_4$—$SiO_2$—Si) type, MONOS (metal-$SiO_2$—$Si_3N_4$—$SiO_2$—Si) type, and a floating gate type. In the following, the MNOS type non-volatile memory transistor will be described as one example.

Referring to FIG. 5, there is shown a diagrammatic sectional view illustrating the prior art MNOS type non-volatile memory transistor. The shown MNOS type non-volatile memory transistor includes a P-type semiconductor substrate having an $N^+$ source diffused layer 2 and an $N^+$ drain diffused layer 3 formed in a principal surface thereof. As a gate insulator film, a gate oxide film 4 and a gate nitride film 5 are formed on the principal surface of the P-type semiconductor substrate between the $N^+$ source diffused layer 2 and the $N^+$ drain diffused layer 3 in the name order. On this gate insulator film, a gate electrode 6, a first interlayer insulator film 7 and a second interlayer insulator film 10 are formed in the named order.

A threshold voltage of this MNOS type non-volatile memory transistor is determined by an impurity concentration of the P-type semiconductor substrate between the $N^+$ source diffused layer 2 and the $N^+$ drain diffused layer 3, the film thickness of the gate oxide film 4 and the gate nitride film 5, and a conducting material constituting the gate electrode 6. If the gate electrode 6 is applied with a predetermined voltage which is positive in comparison with the $N^+$ source diffused layer 2, electrons are injected into an interface between the gate oxide film 4 and the gate nitride film 5, so that the injected electrons are trapped in trapping centers 61 formed in the interface between the gate oxide film 4 and the gate nitride film 5, with the result that the threshold voltage of the MNOS type non-volatile memory transistor becomes a large value. On the other hand, if the $N^+$ source diffused layer 2 is applied with a predetermined voltage which is positive in comparison with the gate electrode 6, the electrons trapped in the trapping centers 61 at the interface between the gate oxide film 4 and the gate nitride film 5 are drawn out, with the result that the threshold voltage of the MNOS type non-volatile memory transistor returns to an original value. The trapping and drawing-out of the electric charges in the non-volatile memory transistor is carried out in a device testing step.

However, when the solid state image sensor is used in the camera, light is incident on not only an image sensing region but also the region other than the image sensing region. If this light, particularly, light in a ultraviolet region is incident on the above mentioned non-volatile memory transistor, the electric charges trapped in the insulating film under the gate electrode obtain an energy, and when the energy becomes larger than an energy level of the trapping center, the electric charge is discharged from the trapping center, with the result that the threshold voltage of the MNOS type non-volatile memory transistor unintentionally changes. In other words, the characteristics of the peripheral circuit including the non-volatile memory transistor changes, with the result that the substrate voltage set once unintentionally changes.

SUMMARY OF THE INVENTION

Accordingly, it is an object of the present invention to provide a solid state image sensor which has overcome the above mentioned problem of the prior art.

Another object of the present invention is to provide a highly reliable solid state image sensor having a stable peripheral circuit including a non-volatile memory transistor such as the MNOS type, the MONOS type and the floating gate, by preventing the variation of the threshold voltage of the non-volatile memory transistor.

The above and other objects of the present invention are achieved in accordance with the present invention by a solid state image sensor comprising a pixel array section formed at a semiconductor substrate, and a substrate voltage setting circuit provided at the semiconductor substrate as a peripheral circuit of the pixel array section and including a non-volatile memory transistor, the pixel array section including a photoelectric converting element array composed of a plurality of photoelectric converting elements formed at the semiconductor substrate, an electric charge transfer section formed at the semiconductor substrate, adjacent to the photoelectric converting elements, for reading out and transferring a signal electric charge from each of the photoelectric converting elements, charge transfer electrodes formed on the electric charge transfer section through a charge transfer gate insulator film for controlling the reading-out and transferring of the signal electric charge by the electric charge transfer section, a light shield film formed in a region other than a light sensitive region of the photoelectric converting elements, to cover the charge transfer electrodes through a protecting insulator film, a first interlayer insulator film formed to cover the whole surface of the semiconductor substrate including the light shield film, and a plurality of kinds of color filters each formed on the first interlayer insulator film to cover the light sensitive region of a corresponding converting element of the photoelectric converting elements, respectively, wherein a light block film is formed to cover at least a gate electrode of the non-volatile memory transistor.

The non-volatile memory transistor is for example a metal-$Si_3N_4$—$SiO_2$—Si type field effect transistor, a metal-$SiO_2$—$Si_3N_4$—$SiO_2$—Si type field effect transistor, or a floating gate type field effect transistor.

As seen from the above, according to the present invention, since the injecting of the light into a gate insulating film of the non-volatile memory transistor is prevented, after the electric charges are trapped in the gate insulating film of the non-volatile memory transistor such as the MNOS type, the MONOS type and the floating gate for giving a desired substrate voltage, the variation of the threshold voltage of the non-volatile memory transistor is prevented which would have otherwise occurred because of an incident light into the gate insulating film, with the result that substrate voltage generating circuit of the peripheral circuit can supply a stabilized substrate voltage having less variation, and therefore, the solid state image sensor operates with a high reliability.

In an embodiment of the solid state image sensor in accordance with the present invention, the plurality of kinds of color filters are constituted of primary color filters, and the light block film is constituted of a single-layer film composed of a red color filter of the primary color filters, or alternatively a multi-layer film composed of at least two stacked different color filters of the primary color filters, including the red color filter.

In another embodiment of the solid state image sensor in accordance with the present invention, the plurality of kinds of color filters are constituted of complementary color filters, and the light block film is constituted of a single-layer film composed of a magenta color filter of the complementary color filters, or alternatively a multi-layer film composed of at least two stacked different color filters of the complementary color filters, including the magenta color filter.

In still another embodiment of the solid state image sensor in accordance with the present invention, the light block film is constituted of the same film as a black filter which covers a region between the photoelectric converting elements or a portion of the photoelectric converting elements.

In a further embodiment of the solid state image sensor in accordance with the present invention, the light block film is constituted of the same film as the light shield film which is formed of a metal to cover the charge transfer electrodes.

In a still further embodiment of the solid state image sensor in accordance with the present invention, the light block film is constituted of an underlying film which is formed of the same film as the light shield film formed of a metal to cover the charge transfer electrodes, and an overlying film which is composed of a single-layer film provided above the underlying film and formed of one color filter of primary or complementary color filters, or alternatively a multi-layer film provided above the underlying film and formed of at least two stacked different color filters of the primary or complementary color filters.

In the latter two embodiments, the light shield film formed of the metal can be connected to the gate electrode of the non-volatile memory transistor so that a potential of the light shield film formed of the metal becomes equal to that of the gate electrode of the non-volatile memory transistor.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the solid state image sensor in accordance with the present invention will be described with reference to the accompanying drawings. In the following embodiments, the present invention is applied to an MNOS type of non-volatile memory transistor of a substrate voltage generating circuit of a peripheral circuit of the solid state image sensor. However, it would be apparent to persons skilled in the art that the present invention can be similarly applied, with no difficulty, to an MONOS type or a floating gate type of non-volatile memory transistor of the substrate voltage generating circuit of the peripheral circuit of the solid state image sensor.

Figure 1:
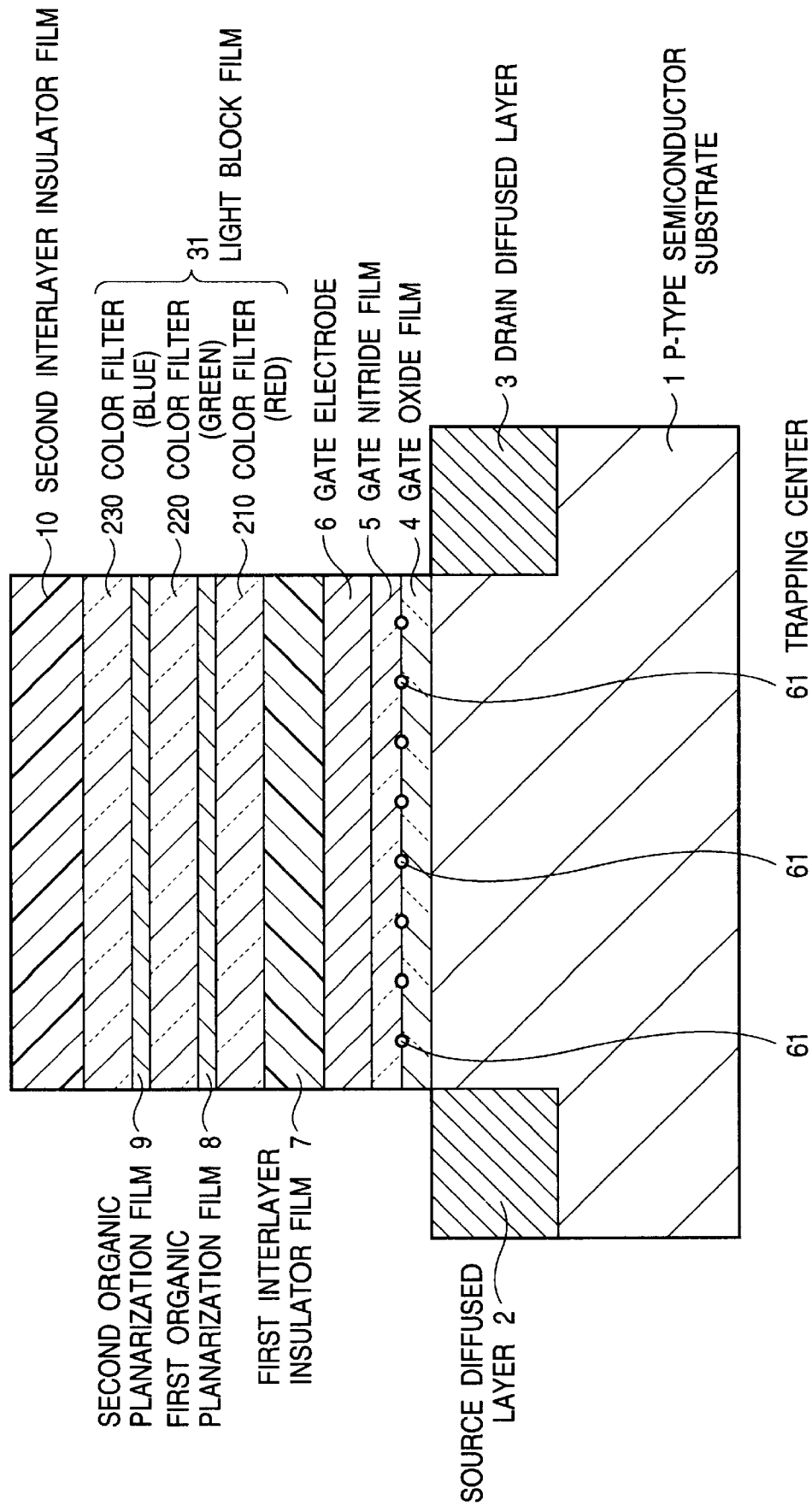
FIG. 1 is a diagrammatic sectional view illustrating a first embodiment of the non-volatile memory transistor included in the solid state image sensor in accordance with the present invention.
Figure 5:
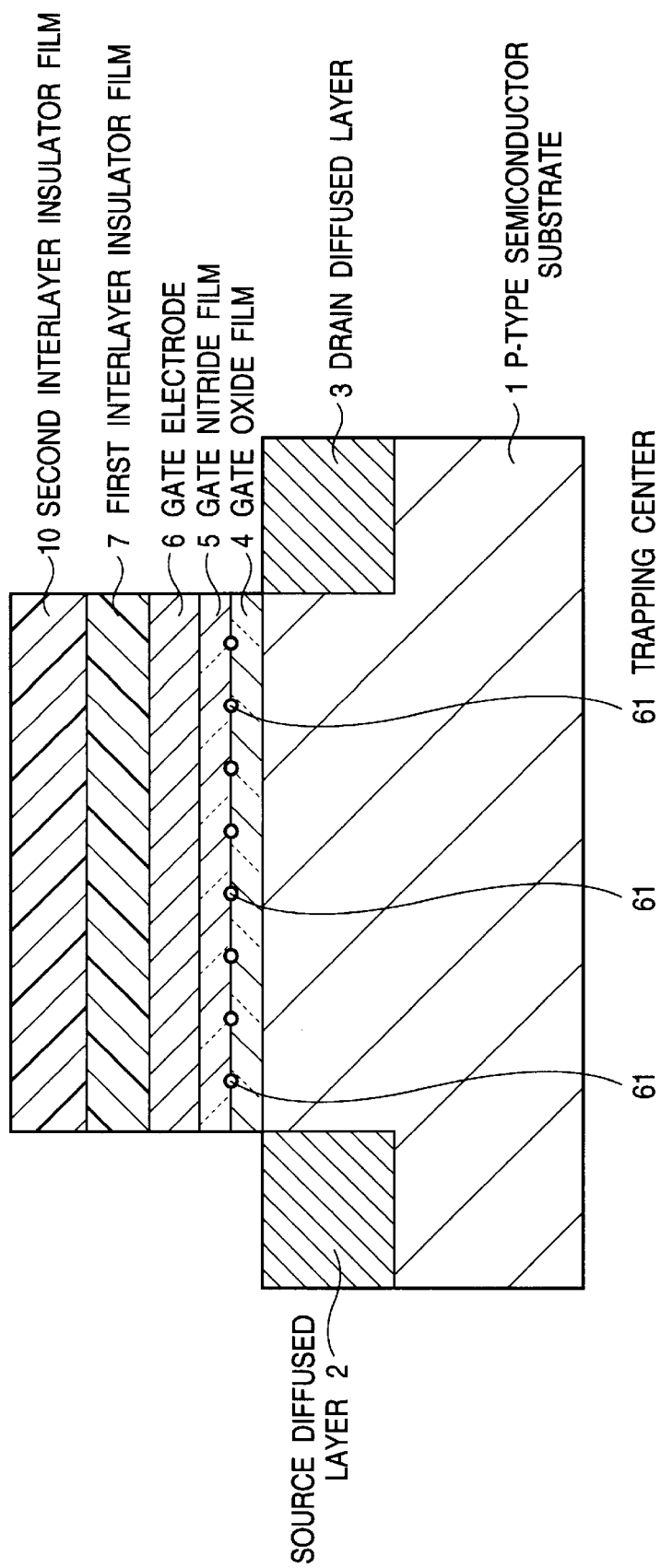
FIG. 5 is a diagrammatic sectional view illustrating the prior art MNOS type non-volatile memory transistor.

Referring to FIG. 1, there is shown a diagrammatic sectional view illustrating a first embodiment of the non-volatile memory transistor included in the solid state image sensor in accordance with the present invention. In FIG. 1, elements corresponding to those shown in FIG. 5 are given the same reference numbers, and explanation will be omitted for simplification. In understanding the structure shown in FIG. 1, since it is indispensable to understand a photoelectric conversion section and a charge transfer section in a pixel array section formed in a central region of the solid state image sensor, first, the pixel array section will be described with reference to FIG. 2, which is a diagrammatic sectional view illustrating the pixel array section formed at the central region of the solid state image sensor.

Figure 2:
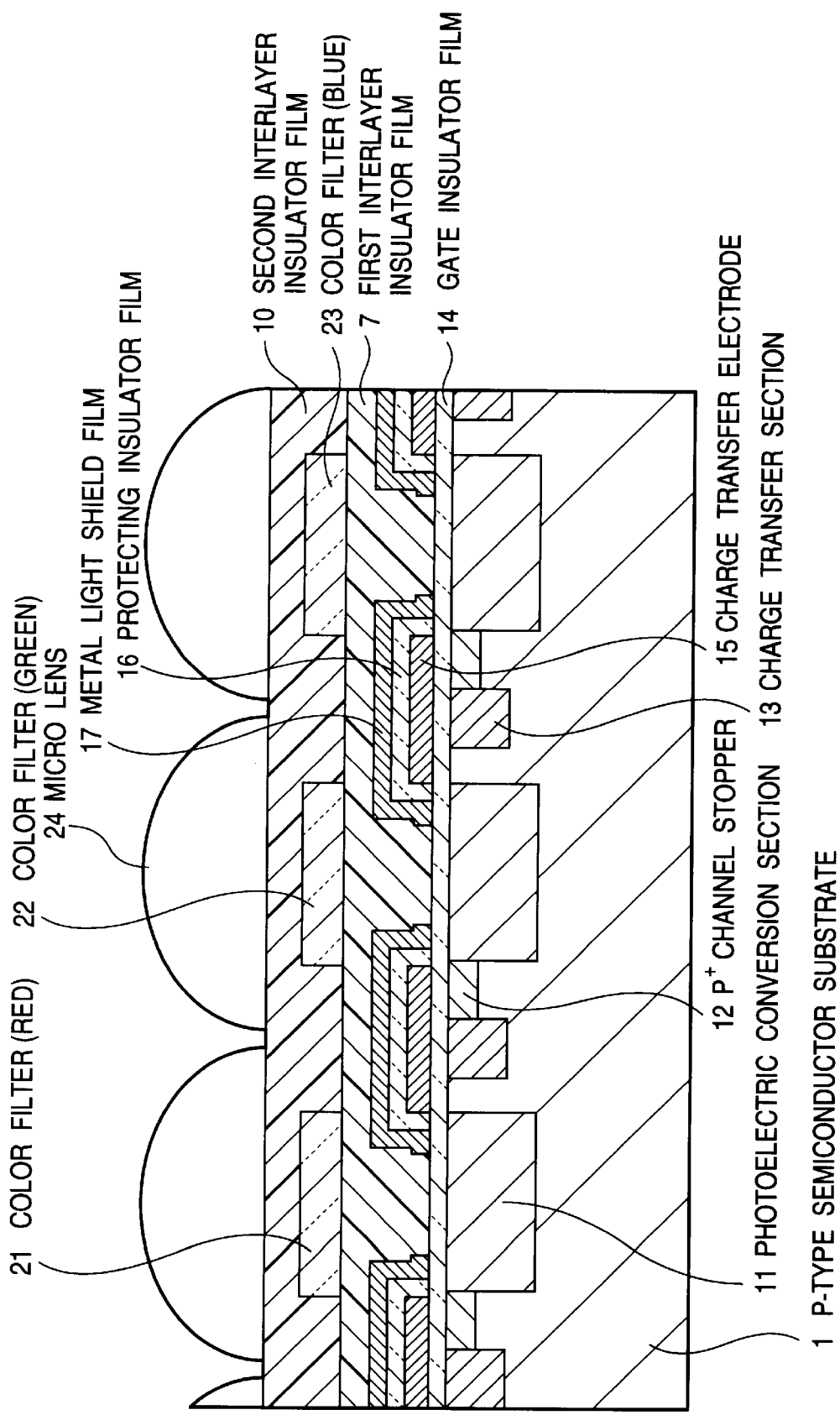
FIG. 2 is a diagrammatic sectional view illustrating a pixel array section formed at a central region of the solid state image sensor in accordance with the present invention including the non-volatile memory transistor shown in FIG. 1.

As shown in FIG. 2, the pixel array section formed at the central region of the solid state image sensor includes a plurality of N-type photoelectric conversion sections 11 formed in a principal surface of a P-type semiconductor substrate 1, separately from one another, but to constitute a plurality of N-type photoelectric conversion cell arrays, electric charge transfer sections 13 formed in the principal surface of the P-type semiconductor substrate 1, each adjacent to one array of the photoelectric converting elements but located to interpose a $P^+$ channel stopper 12 between the electric charge transfer section 13 and the photoelectric conversion section 11, for reading out and transferring a signal electric charge from each of the photoelectric conversion sections.

A charge transfer gate insulator film 14 is formed to cover the whole surface of the principal surface of the semiconductor substrate 1.

A plurality of charge transfer electrodes 15 are formed on the charge transfer gate insulator film 14 located on the electric charge transfer section 13 and are arranged in a direction perpendicular to the face of the drawing, for controlling the reading-out and transferring of the signal electric charge by the electric charge transfer section. A protecting insulator film 16 is formed to cover the charge transfer electrodes 15, and a metal light shield film 17 is formed on the protecting insulator film 16 to cover the charge transfer electrodes 13. In other words, the metal light shield film 17 is formed in a region other than the photoelectric conversion section 11 (namely, in a region other than a light sensitive region of a photoelectric converting element). A first interlayer insulator film 7 is formed to cover the whole surface of the semiconductor substrate including the light shield film 17, and red, green and blue primary color filters 21, 22 and 23 are formed on the first interlayer insulator film 7 each to cover a corresponding photoelectric conversion section of the photoelectric conversion sections 11, respectively. A second interlayer insulator film 10 is formed to cover the whole surface of the first interlayer insulator film 7 including the color filters 21, 22 and 23, and micro lens 24 are formed on the second interlayer insulator film 10 each in light axis alignment with a corresponding photoelectric conversion section of the photoelectric conversion sections 11, in order to effectively concentrate the incident light into each photoelectric conversion section 11.

Now, an operation of the pixel array section will be described. A signal electric charge generated by a photoelectric conversion in response to an incident light is accumulated in each photoelectric conversion section 11, and then, read out to the charge transfer section 13. The signal electric charges read out to the charge transfer section 13 are transferred in the charge transfer section 13 in a direction perpendicular to the face of the drawing in response to a series of transfer pulses. If the light is incident on the charge transfer section 13, the photoelectric conversion occurs so that a spurious electric charge is generated. If this spurious electric charge is mixed to the signal charge read out from the photoelectric conversion section 11, an accurate image signal can no longer be obtained. In order to prevent this disadvantage, the metal light shield film 17 is formed on the protecting insulator film 16 to cover the charge transfer electrodes 13. The metal light shield film 17 is formed of for example aluminum. In this metal light shield film 17, openings are formed in only places positioned just above the photoelectric conversion sections 11, to prevent the light from injecting to the regions other than the photoelectric conversion sections 11.

Returning to FIG. 1, a light block film 31 is formed on the first interlayer insulator film 7 at a position of the gate electrode 6 of the non-volatile memory transistor of the peripheral circuit. This light block film 31 is formed of a red color filter 210, a green color filter 220 and a blue color filter 230 which are stacked on a place of the first interlayer insulator film 7 positioned above the gate electrode 6. The red color filter 210, the green color filter 220 and the blue color filter 230 are formed at the same time as the red color filter 21, the green color filter 22 and the blue color filter 23 are formed respectively. A first organic planarization film 8 is interposed between the red color filter 210 and the green color filter 220, and a second organic planarization film 9 is interposed between the green color filter 220 and the blue color filter 230.

In this first embodiment, since all of three different primary color filters are formed in a stacked form above the non-volatile memory transistor of the peripheral circuit, in particular, above the gate electrode 6 of the non-volatile memory transistor of the peripheral circuit, the gate insulator of the non-volatile memory transistor is completely shielded from the incident light. No light is incident on the gate insulator of the non-volatile memory transistor, so that no electric charge trapped in the trapping centers 61 is discharged, with the result that the threshold of the non-volatile memory transistor does not change, and therefore, a stably circuit characteristics is obtained. Namely, since a stable substrate voltage is obtained, a reliability of the solid state image sensor can be elevated.

In the above mentioned embodiment, the three different primary color filters are used as the color filters. However, it would be a matter of course that three complementary color filters can be used as the color filters. In this case, the light block film 31 is formed of the three different complementary color filters.

In addition, in the above mentioned embodiment, the light block film 31 is formed of all the three primary color filters. However, the light block film can be constituted of a single-layer film composed of a red color filter or a magenta color filter which can shield a light that has the longest wavelength within the primary or complementary colors and that has the high energy within the primary or complementary colors. Alternatively, the light block film can be constituted of a multi-layer film composed of at least two stacked different color filters of the primary or complementary color filters, including the red color filter or the magenta color filter.

As an alternative embodiment, when there is provided a black filter which covers a region between the adjacent photoelectric conversion sections 11 or a portion of the photoelectric conversion sections 11 in order to elevate the light shielding property, the light block film can be constituted of the same film as the black filter.

Figure 3:
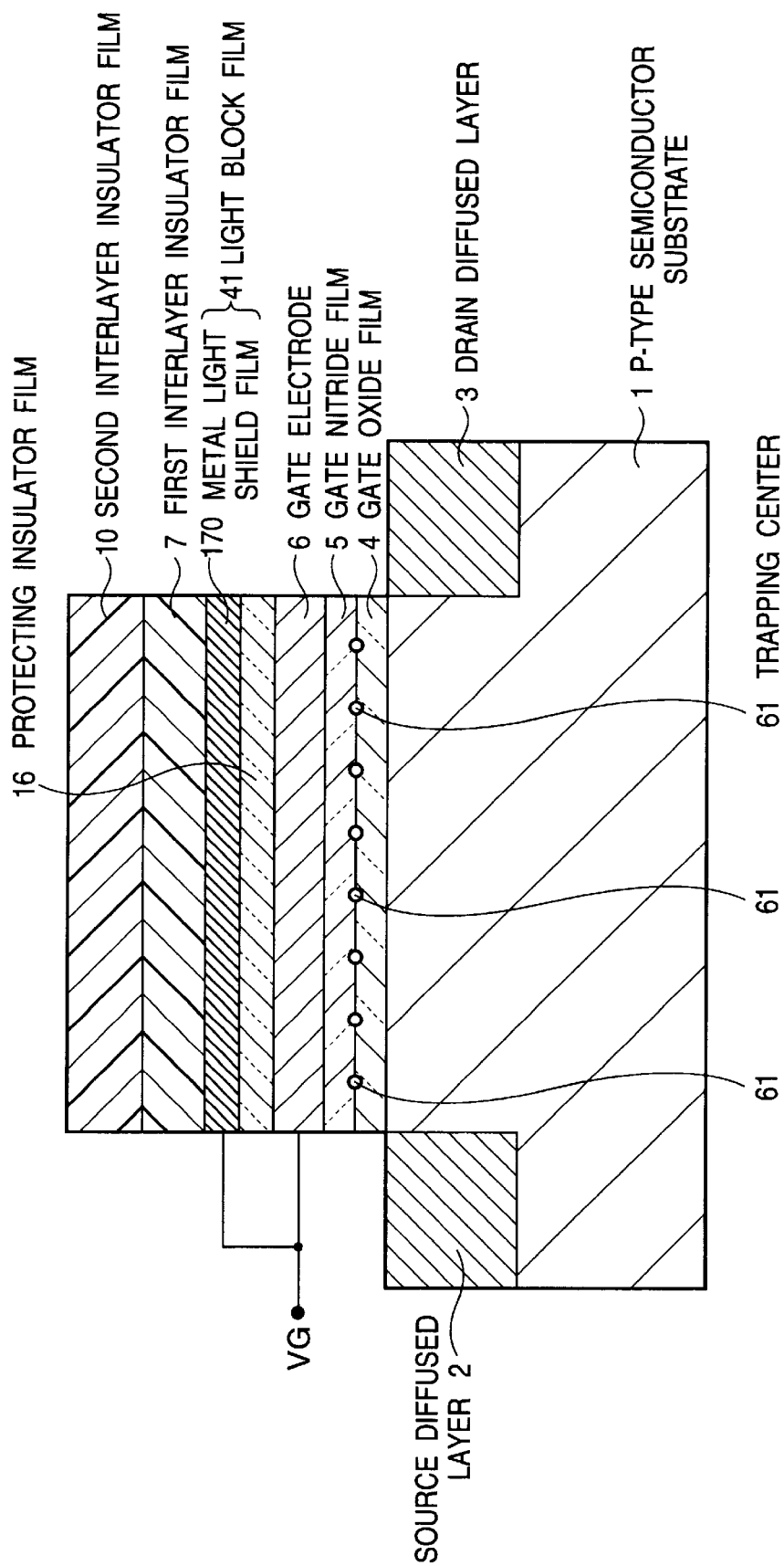
FIG. 3 is a diagrammatic sectional view illustrating a second embodiment of the non-volatile memory transistor included in the solid state image sensor in accordance with the present invention.

Referring to FIG. 3, there is shown a diagrammatic sectional view illustrating a second embodiment of the non-volatile memory transistor included in the solid state image sensor in accordance with the present invention. In FIG. 3, elements corresponding to those shown in FIG. 1 are given the same reference numbers, and explanation will be omitted for simplification of description. In addition, since the pixel array section of the solid state image sensor having the peripheral circuit including the non-volatile memory transistor shown in FIG. 3 is the same as that shown in FIG. 2, explanation will be also omitted.

In this second embodiment, a light block film 41 formed to cover the gate electrode 6 is formed of a metal light shield film 170 which is the same film as the metal light shield film 17 formed to cover the charge transfer electrode 15 in FIG. 2. Therefore, the protecting insulator film 16 is formed on the gate electrode 6, and the metal light shield film 170 is formed on the protecting insulator film 16. The first and second interlayer insulator films 7 and 10 are formed on the metal light shield film 170 in the named order.

In this second embodiment, furthermore, the metal light shield film 170 is electrically connected to the gate electrode 6 of the non-volatile memory transistor. When a high voltage is applied to the gate electrode 6 of the non-volatile memory transistor in order to trap the electric charges at the interface between the gate oxide film 4 and the gate nitride film 5 of the non-volatile memory transistor, since a potential of the light shield film 170 becomes equal to that of the gate electrode 6 of the non-volatile memory transistor, no electric field is applied across the protecting insulator film 16, and therefore, the protecting insulator film 16 is in no way broken down.

In addition, since the light block film 41 of the metal is formed on the non-volatile memory transistor of the peripheral circuit, at least on the gate electrode 6 of the non-volatile memory transistor, the gate insulator of the non-volatile memory transistor is completely shielded from the incident light. No light is incident on the gate insulator of the non-volatile memory transistor, so that no electric charge trapped in the. trapping centers 61 is discharged, with the result that the threshold of the non-volatile memory transistor does not change, and therefore, a stably circuit characteristics is obtained. Namely, since a stable substrate voltage is obtained, a reliability of the solid state image sensor can be elevated.

Figure 4:
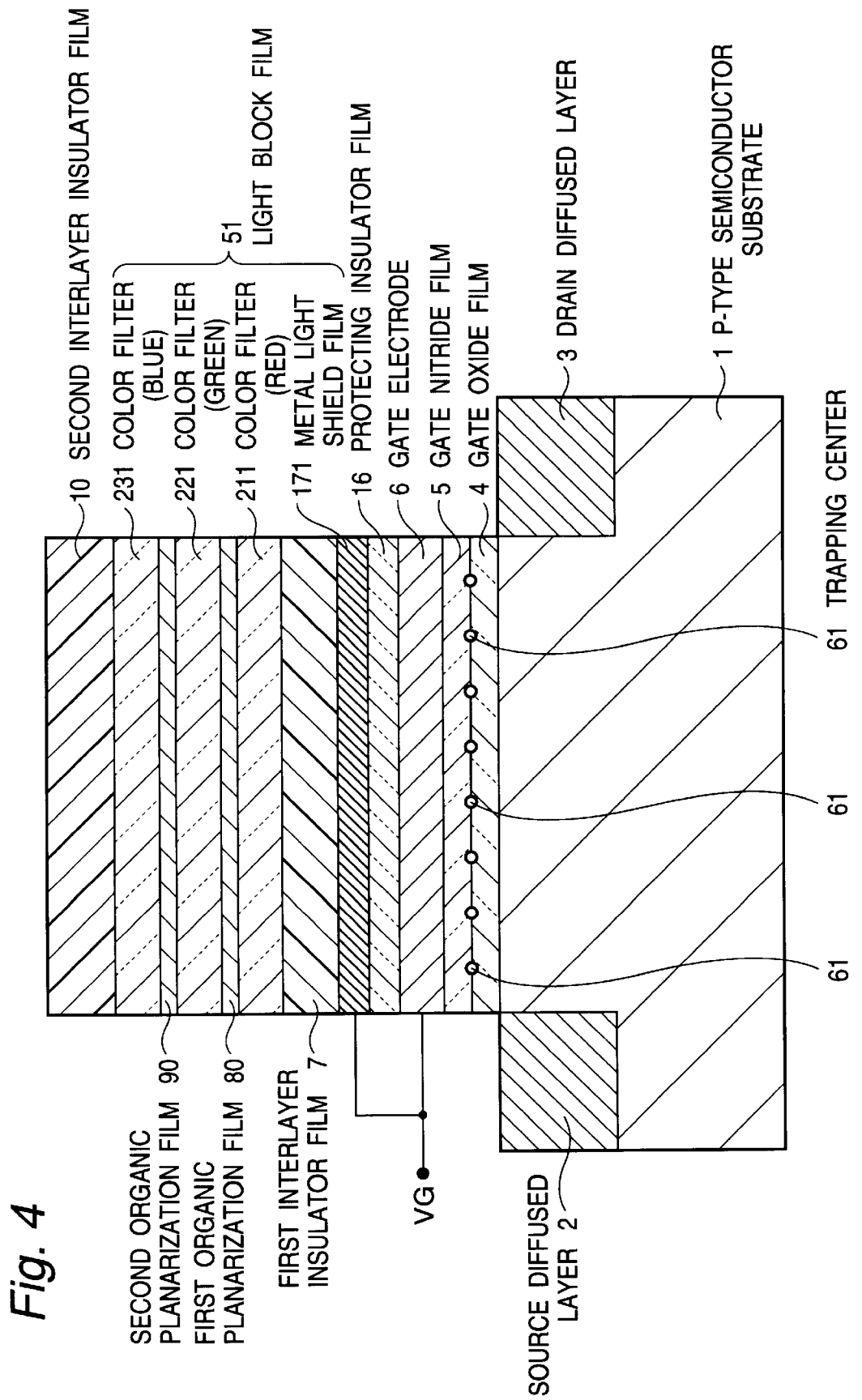
FIG. 4 is a diagrammatic sectional view illustrating a third embodiment of the non-volatile memory transistor included in the solid state image sensor in accordance with the present invention.

Referring to FIG. 4, there is shown a diagrammatic sectional view illustrating a third embodiment of the non-volatile memory transistor included in the solid state image sensor in accordance with the present invention. In FIG. 4, elements corresponding to those shown in FIG. 1 are given the same reference numbers, and explanation will be omitted for simplification of description. In addition, since the pixel array section of the solid state image sensor having the peripheral circuit including the non-volatile memory transistor shown in FIG. 4 is the same as that shown in FIG. 2, explanation will be also omitted.

In this third embodiment, a metal light shield film 171 which is formed of the same film as the metal light shield film 17 covering a portion of a light sensitive portion, is formed to cover the gate electrode 6 as shown in FIG. 4. Therefore, the protecting insulator film 16 is formed on the gate electrode 6, and the metal light shield film 171 is formed on the protecting insulator film 16 and is covered with the first interlayer insulator film 7. Furthermore, a red color filter 211, a green color filter 221 and a blue color filter 231 are stacked in the named order on the first interlayer insulator film 7 in a place positioned above the gate electrode 6. The red color filter 211, the green color filter 221 and the blue color filter 231 are formed at the same time as the red color filter 21, the green color filter 22 and the blue color filter 23 are formed respectively. A first organic planarization film 8 is interposed between the red color filter 211 and the green color filter 221, and a second organic planarization film 9 is interposed between the green color filter 221 and the blue color filter 231. The second interlayer insulator film 10 is formed on the blue color filter 231.

In this embodiment, a light block film 51 is constituted of a double layer structure composed of the metal light shield film 171 (as an underlying light block layer) and the color filter layers formed of the color filters 211, 221 and 231 (as an overlying light block layer).

Therefore, even if pin holes are generated in the metal light shield film 171, the incident light is blocked by the overlying triple-layer color filter layers. Therefore, a circuit characteristics having a further elevated reliability can be obtained.

As seen from the above, according to the present invention, since the light block film is provided on the gate electrode of the non-volatile memory transistor, the injecting of the light into the gate insulating film of the non-volatile memory transistor is prevented. Therefore, after the electric charges are trapped in the gate insulating film of the non-volatile memory transistor such as the MNOS type, the MONOS type and the floating gate for giving a desired substrate voltage, the electric charges trapped in the gate insulating film of the non-volatile memory transistor are in no way discharged, so that the variation of the threshold voltage of the non-volatile memory transistor is prevented. As a result, the substrate voltage generating circuit of the peripheral circuit including the non volatile memory transistor can supply the stabilized substrate voltage having less variation, and therefore, the solid state image sensor operates with a high reliability.

The invention has thus been shown and described with reference to the specific embodiments. However, it should be noted that the present invention is in no way limited to the details of the illustrated structures but changes and modifications may be made within the scope of the appended claims.

What is claimed is:

1. A solid state image sensor comprising a pixel array section formed at a semiconductor substrate, and a substrate voltage setting circuit provided at said semiconductor substrate as a peripheral circuit of said pixel array section and including a non-volatile memory transistor, said pixel array section including a photoelectric converting element array composed of a plurality of photoelectric converting elements formed at said semiconductor substrate, an electric charge transfer section formed at said semiconductor substrate, adjacent to said photoelectric converting elements, for reading out and transferring a signal electric charge from each of said photoelectric converting elements, charge transfer electrodes formed on said electric charge transfer section through a charge transfer gate insulator film for controlling the reading-out and transferring of said signal electric charge by said electric charge transfer section, a light shield film formed in a region other than a light sensitive region of said photoelectric converting elements, to cover said charge transfer electrodes through a protecting insulator film, a first interlayer insulator film formed to cover the whole surface of said semiconductor substrate including said light shield film, and a plurality of kinds of color filters each formed on said first interlayer insulator film to cover said light sensitive region of a corresponding converting element of said photoelectric converting elements, respectively, wherein a light block film is formed to cover at least a gate electrode of said non-volatile memory transistor.

2. A solid state image sensor claimed in claim 1 wherein said nonvolatile memory transistor is one selected from the group consisting of a metal-$Si_3N_4$—$SiO_2$—Si type field effect transistor, a metal-$SiO_2$—$Si_3N_4$—$SiO_2$—Si type field effect transistor, and a floating gate type field effect transistor.

3. A solid state image sensor claimed in claim 1 wherein said plurality of kinds of color filters are constituted of primary color filters, and said light block film is constituted of a single-layer film composed of a red color filter of said primary color filters, or alternatively a multi-layer film composed of at least two stacked different color filters of said primary color filters, including the red color filter.

4. A solid state image sensor claimed in claim 1 wherein said plurality of kinds of color filters are constituted of complementary color filters, and said light block film is constituted of a single-layer film composed of a magenta color filter of said complementary color filters, or alternatively a multi-layer film composed of at least two stacked different color filters of said complementary color filters, including the magenta color filter.

5. A solid state image sensor claimed in claim 1 wherein said light block film is constituted of the same film as a black filter which covers a region between said photoelectric converting elements or a portion of said photoelectric converting elements.

6. A solid state image sensor claimed in claim 1 wherein said light block film is constituted of the same film as said light shield film which is formed of a metal to cover said charge transfer electrodes.

7. A solid state image sensor claimed in claim 1 wherein said light block film is constituted of an underlying film which is formed of the same film as said light shield film formed of a metal to cover said charge transfer electrodes, and an overlying film which is composed of a single layer film provided above said underlying film and formed of one color filter of primary or complementary color filters, or alternatively a multilayer film provided above said underlying film and formed of at least two stacked different color filters of said primary or complementary color filters.

8. A solid state image sensor claimed in claim 6 wherein said light shield film formed of the metal is connected to said gate electrode of said non-volatile memory transistor so that a potential of said light shield film formed of the metal becomes equal to that of said gate electrode of said non-volatile memory transistor.

9. A solid state image sensor claimed in claim 7 wherein said light shield film formed of the metal is connected to said gate electrode of said non-volatile memory transistor so that a potential of said light shield film formed of the metal becomes equal to that of said gate electrode of said non-volatile memory transistor.

* * * * *